US012791765B2

(12) United States Patent
Ceballos

(10) Patent No.: US 12,791,765 B2
(45) Date of Patent: Nov. 10, 2026

(54) METHOD FOR INTEGRATION OF OPTICAL DEVICE FABRICATION WITH SUBSTRATE THICKNESS ENGINEERING

(71) Applicant: Applied Materials, Inc., Santa Clara, CA (US)

(72) Inventor: Andrew Ceballos, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 354 days.

(21) Appl. No.: 18/471,005

(22) Filed: Sep. 20, 2023

(65) Prior Publication Data

US 2024/0094440 A1 Mar. 21, 2024

Related U.S. Application Data

(60) Provisional application No. 63/408,410, filed on Sep. 20, 2022.

(51) Int. Cl.

| | |
|---|---|
| ***G02B 1/14*** | (2015.01) |
| ***B82Y 40/00*** | (2011.01) |
| ***G02B 1/00*** | (2006.01) |
| ***G03F 7/00*** | (2006.01) |
| *B82Y 20/00* | (2011.01) |

(52) U.S. Cl.

CPC ............... *G02B 1/14* (2015.01); *G02B 1/002* (2013.01); *G03F 7/0002* (2013.01); *B82Y 20/00* (2013.01); *B82Y 40/00* (2013.01)

(58) Field of Classification Search

CPC .. G02B 5/285–288; G02B 1/14; G02B 1/002; G02B 5/1819; G02B 5/1857; G02B 6/0016; G03F 7/0002; B82Y 20/00; B82Y 40/00

See application file for complete search history.

(56) References Cited

U.S. PATENT DOCUMENTS

2002/0135778 A1 9/2002 Folta et al.
2015/0131035 A1* 5/2015 Chen ................ G02F 1/133533 427/163.1
2019/0137777 A1 5/2019 Yang et al.
2019/0391484 A1* 12/2019 Chiba ..................... B29C 59/02

(Continued)

FOREIGN PATENT DOCUMENTS

KR 2009-0073720 A 7/2009

OTHER PUBLICATIONS

International Search Report dated Jan. 8, 2024 for Application No. PCT/US2023/033232.

*Primary Examiner* — Jonathan Y Jung
(74) *Attorney, Agent, or Firm* — Patterson + Sheridan, LLP

(57) ABSTRACT

Embodiments of the present disclosure generally relate to the introduction of an encapsulation material into an optical device formed with a same thickness distribution at one or more eyepiece areas across a substrate. The target thickness distribution formed in at least each eyepiece area reduces variation of substrate thickness from substrate to substrate. Forming the target thickness distribution in the substrate and the index-matched layer with maskless patterning such as gray-tone lithography and inkjet printing eliminates subsequent processing steps to achieve the target thickness distribution. An encapsulation material between the optical device layer and the index-matched layer will protect the index-matched layer from damage.

19 Claims, 5 Drawing Sheets

(56) References Cited

U.S. PATENT DOCUMENTS

| | | | | |
|---|---|---|---|---|
| 2020/0003936 | A1* | 1/2020 | Fu | G02B 5/1852 |
| 2020/0409151 | A1* | 12/2020 | Calafiore | G02B 27/4272 |
| 2021/0199971 | A1* | 7/2021 | Lee | G02B 27/0172 |
| 2021/0382212 | A1 | 12/2021 | Sell et al. | |
| 2022/0082936 | A1* | 3/2022 | Franke | G02B 27/0172 |
| 2022/0152724 | A1 | 5/2022 | Luo et al. | |

* cited by examiner

METHOD FOR INTEGRATION OF OPTICAL DEVICE FABRICATION WITH SUBSTRATE THICKNESS ENGINEERING

CROSS-REFERENCE TO RELATED APPLICATION(S)

This application claims benefit of and priority to U.S. Application No. 63/408,410, filed Sep. 20, 2022, the entire contents of which are incorporated herein by reference.

BACKGROUND

Field

Embodiments of the present disclosure generally relate to optical devices. More specifically, embodiments described herein provide for the introduction of an encapsulation material into an optical device formed with a same thickness distribution at one or more eyepiece areas across a substrate.

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as optical devices to display a virtual reality environment that replaces an actual environment.

Augmented reality, however, enables an experience in which a user can still see through the optical devices of the glasses or other HMD device to view the surrounding environment, yet also see images of virtual objects that are generated for display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

Having the same thickness distribution at one or more eyepiece areas across a substrate alleviates substrate-to-substrate variation. To facilitate achievement of the same thickness distribution, an index-matched layer is patterned. The optical device is subsequently patterned. Accordingly, what is needed in the art are improved methods of patterning the index-matched layer.

SUMMARY

In one embodiment, an optical device is provided. The optical device includes a substrate having a substrate depth defined by a top surface of the substrate and a bottom surface of the substrate. The substrate depth varies across the optical device. The optical device includes an index-matched layer disposed over the substrate. The index-matched layer has a layer depth defined by an upper surface of the index-matched layer and a lower surface of the index-matched layer. The layer depth varies across the optical device. The optical device includes a plurality of optical device structures formed over the index-matched layer. The adjacent structure top surfaces of the plurality of optical device structures are planar. The optical device further includes an encapsulation material disposed between the plurality of optical device structures and the index-matched layer.

In another embodiment, a method of forming an optical device is provided. The method includes disposing an index-matched layer over a substrate. The substrate has a substrate depth defined by a top surface of the substrate and a bottom surface of the substrate. The substrate depth varies across the optical device such that a lower surface of the index-matched layer varies according to the substrate depth. The method includes patterning the index-matched layer. The index-matched layer and the substrate define a target thickness distribution that varies across the substrate. The method further includes disposing an encapsulation layer over an upper surface of the index-matched layer. The method includes disposing an optical device film over the encapsulation layer. The method further includes patterning a plurality of optical device structures in the optical device film. The adjacent structure top surfaces of the plurality of optical device structures are planar. A device height defined from the bottom surface to each of the structure top surfaces is constant.

In another embodiment, a method of forming an optical device is provided. The method includes disposing an index-matched layer over a substrate. The substrate has a substrate depth defined by a top surface of the substrate and a bottom surface of the substrate. The substrate depth varies across the optical device such that a lower surface of the index-matched layer varies according to the substrate depth. The method includes patterning the index-matched layer. The index-matched layer and the substrate define a target thickness distribution that varies across the substrate. The method includes disposing an encapsulation material into the index-matched layer to form an encapsulation material gradient. A concentration of the encapsulation material decreases as a distance from an upper surface of the index-matched layer is increased. The method includes disposing an optical device film over the encapsulation material. The method further includes patterning a plurality of optical device structures in the optical device film. The adjacent structure top surfaces of the plurality of optical device structures are planar. A device height defined from the bottom surface to each of the structure top surfaces is constant.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to optical devices. More specifically, embodiments described herein provide for the introduction of an encapsulation material into an optical device formed with a same thickness distribution at one or more eyepiece areas across a substrate.

Figure 1:
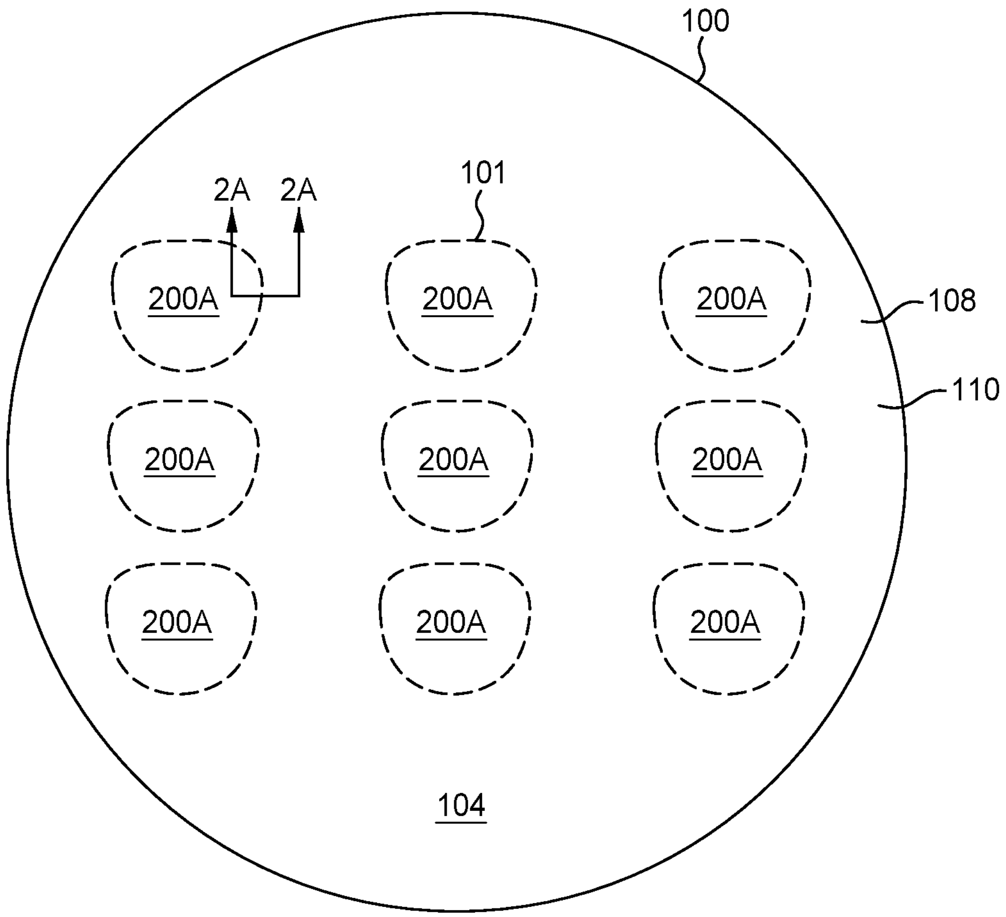
FIG. 1 is a schematic, top view of a substrate, according to embodiments.

FIG. 1 is a schematic, top view of a substrate 100. The substrate 100 includes a plurality of eyepiece areas 101. The eyepiece areas 101 are areas of the substrate 100 where one of an optical device 200A or 200B (shown in FIGS. 2A and 2B) are formed. Although only nine of the eyepiece areas 101 are shown in FIG. 1A, the substrate 100 is not limited in the number of the eyepiece areas 101 corresponding to a number of optical devices 200A or 200B formed thereon. The substrate 100 may include an index-matched layer 108 formed thereon. Although FIG. 1 shows optical device 200A disposed thereon, optical devices 200B (shown in FIG. 2B) may also be disposed on the substrate 100. Inactive areas 104 are disposed between and around the eyepiece areas 101. The inactive areas 104 are areas of the substrate 100 that will not have one of the optical devices 200A or 200B formed thereon.

In one embodiment, which can be combined with other embodiments described herein, the optical devices 200A or 200B are waveguide combiners, such as augmented reality waveguide combiners. In another embodiment, which can be combined with other embodiments described herein, the optical devices 200A or 200B are flat optical devices, such as metasurfaces.

Figure 2A:
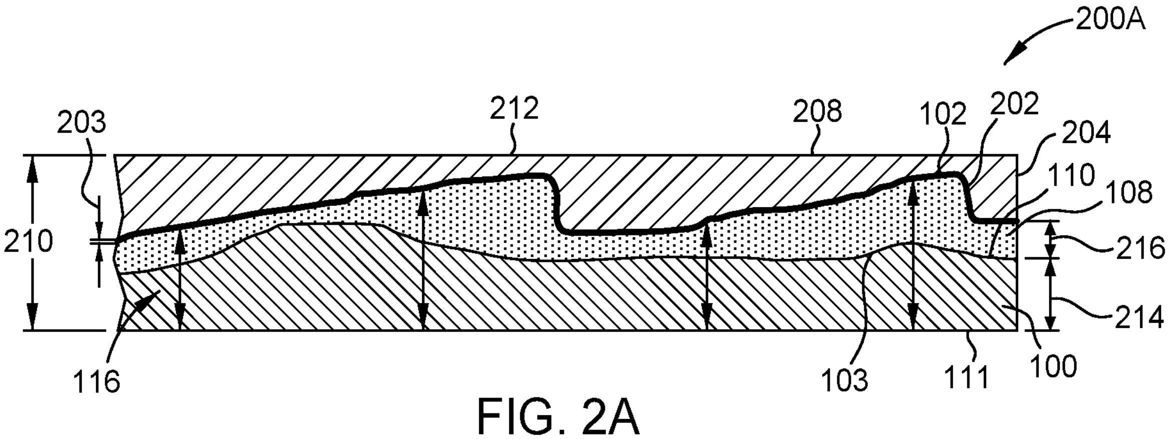
FIG. 2A is a schematic, cross-sectional view of a portion of an optical device, according to embodiments.
Figure 2B:
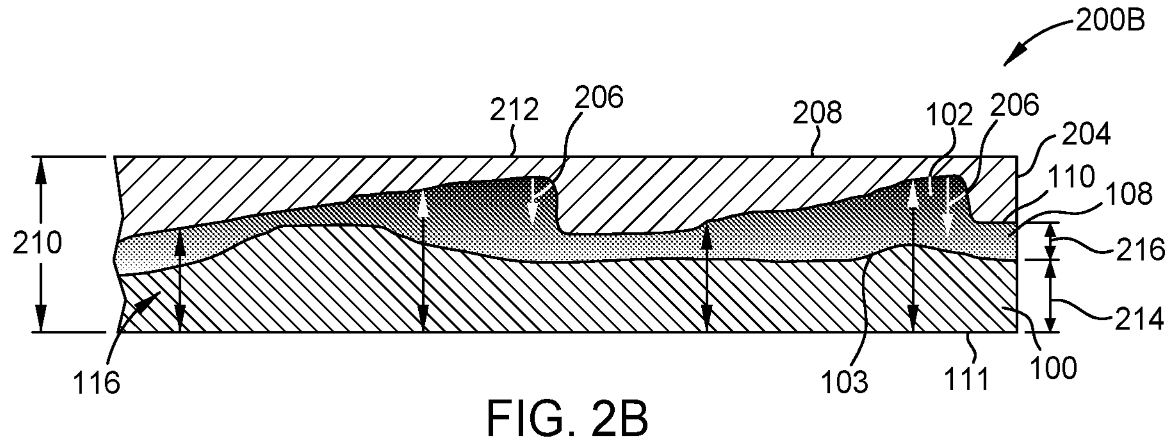
FIG. 2B is a schematic, cross-sectional view of a portion of an optical device, according to embodiments.

FIG. 2A is a schematic, cross-sectional view of a portion of an optical device 200A. FIG. 2B is a schematic, cross-sectional view of a portion of an optical device 200B. The optical device 200A or 200B includes the substrate 100. The substrate 100 includes a top surface 110 and a bottom surface 111. The index-matched layer 108 is disposed over the substrate 100. The index-matched layer 108 includes an upper surface 102 and a lower surface 103. The index-matched layer 108 has a refractive index that matches or substantially matches the refractive index of the substrate 100. For example, the refractive index of the index-matched layer 108 and the refractive index of the substrate 100 are within about 5% of each other. The refractive index of the substrate 100 and the index-matched layer 108 is between about 1.7 and about 2.9. The difference between the refractive index of the substrate 100 and the index-matched layer 108 is between about 0 and about 0.1.

The substrate 100 and the index-matched layer 108 may be formed from any suitable material, provided that the substrate 100 can adequately transmit light in a desired wavelength or wavelength range and can serve as an adequate support for the optical devices 200A or 200B. The substrate 100 may be a material including, but not limited to, amorphous dielectrics, non-amorphous dielectrics, crystalline dielectrics, silicon oxide, polymers, and combinations thereof. In some embodiments, which may be combined with other embodiments described herein, the substrate 100 includes a transparent material. In one example, the substrate 100 includes silicon (Si), silicon dioxide ($SiO_2$), fused silica, quartz, silicon carbide (SiC), germanium (Ge), silicon germanium (SiGe), indium phosphide (InP), gallium arsenide (GaAs), gallium nitride (GaN), sapphire, or combinations thereof. The index-matched layer 108 is a nanoparticle material. For example, the index-matched layer 108 is titanium oxide ($TiO_2$) or zirconium oxide ($ZrO_2$). In one example, the substrate 100 and the index-matched layer 108 are different materials. In another example, the substrate 100 and the index-matched layer 108 are the same material.

The substrate 100 and the index-matched layer 108 form a target thickness distribution 116. The target thickness distribution 116 is the local thickness distribution that has been determined to be replicated at each of the eyepiece areas 101. The target thickness distribution 116 is defined by the distance between the upper surface 102 of the index-matched layer 108 and the bottom surface 111 of the substrate 100 across the eyepiece area 101. In one example, the target thickness distribution 116 is a linear distribution. In another example, the target thickness distribution 116 is a nonlinear distribution. The target thickness distribution 116 varies across the substrate 100 of the optical device 200A or 200B. In one embodiment, which can be combined with other embodiments described herein, the target thickness distribution 116 is in the eyepiece areas 101 and the inactive areas 104. In another embodiment, which can be combined with other embodiments described herein, the target thickness distribution 116 is only in the eyepiece areas 101. In some embodiments, which can be combined with other embodiments described herein, the top surface 110 of the substrate 100 is planar relative to the bottom surface 111 of the substrate 100.

The substrate 100 includes a substrate depth 214. The substrate depth 214 is defined as the distance between the top surface 110 and the bottom surface 111 of the substrate 100. The substrate depth 214 varies across the optical device 200A or 200B. The index-matched layer 108 includes a layer depth 216. The layer depth 216 is defined as the distance between the upper surface 102 of the index-matched layer 108 and the top surface 110 of the substrate 100. The layer depth 216 varies across the optical device 200A or 200B. The index-matched layer 108 is disposed over the substrate 100 such that the varying substrate depth 214 defines where the lower surface 103 of the index-matched layer 108 is positioned. As such, the positioning of the lower surface 103 varies according to the substrate depth 214.

The target thickness distribution 116 is engineered to improve the performance of the optical devices 200A or 200B formed thereon. The target thickness distribution 116 is the same in at least each eyepiece area 101 of the substrate 100 and the index-matched layer 108. Methods described herein will provide for the target thickness distribution 116 to be achieved in at least each eyepiece area 101. The target thickness distribution 116 is not limited to the target thickness distribution 116 shown in FIGS. 2A and 2B and may be any thickness distribution determined to be suitable and improve the performance of the optical devices 200A or 200B.

In one embodiment, as shown in FIG. 2A, an encapsulation layer 202 is disposed over the index-matched layer 108. The encapsulation layer 202 is conformal to the index-matched layer 108. The encapsulation layer 202 has an encapsulation thickness 203. Therefore, the encapsulation layer 202 will be formed according to the target thickness distribution 116. The encapsulation layer 202 includes an encapsulation material. In one example, the encapsulation material is a nitrogen containing material. The encapsulation material has an encapsulation refractive index. In one example, the encapsulation refractive index is matched to the refractive index of the substrate 100 and the refractive index of the index-matched layer 108. In another example, the encapsulation refractive index is matched to a refractive index of an optical device layer 204 disposed over the encapsulation layer 202. As such, the encapsulation refractive index is between about 1.7 and about 2.9.

In another embodiment, as show in FIG. 2B, an encapsulation material gradient 206 is formed in the index-matched layer 108. The encapsulation material gradient 206 is formed by infiltrating the encapsulation material into the index-matched layer 108. The encapsulation material of the encapsulation material gradient 206 is at a higher concentration at the upper surface 102 of the index-matched layer 108. The encapsulation material of the encapsulation material gradient 206 has a concentration that decreases as a distance from the upper surface 102 is increased. The concentration of the encapsulation material in the encapsulation material gradient 206 may be higher where the index-matched layer 108 is furthest from the bottom surface 111 of the substrate 100. In some embodiments, which can be combined with other embodiments described herein, the encapsulation material gradient 206 is formed in the index-matched layer 108 and at least partially in the substrate 100.

In one example, the optical device layer 204 is disposed over the encapsulation layer 202 (shown in FIG. 2A). In another example, the optical device layer 204 is disposed over the encapsulation material gradient 206 (shown in FIG. 2B). The optical device layer 204 includes a plurality of optical device structures 208. The plurality of optical device structures 208 are formed in an eyepiece area 101 of the substrate. The optical device layer 204 is a polymer material or a nanoparticle based material.

The plurality of optical device structures 208 may be nanostructures having sub-micron dimensions, e.g., nanosized dimensions. The plurality of optical device structures 208 may correspond to an input coupling grating or an output coupling grating of the optical devices 200A or 200B. The optical devices 200A or 200B are not limited to the number of the plurality of optical device structures 208 shown in FIGS. 2A and 2B. Although the plurality of optical device structures 208 shown in FIGS. 2A and 2B are perpendicular relative to a bottom surface 111 of the substrate 100, the plurality of optical device structures 208 may be angled (e.g., non-perpendicular) relative to the bottom surface 111 of the substrate 100. The optical devices 200A or 200B are formed such that a device height 210 is constant across the eyepiece area 101. The device height 210 is defined as the distance between the bottom surface 111 of the substrate 100 and a structure top surface 212 of the plurality of optical device structures 208. For example, each adjacent structure top surface 212 of the plurality of optical device structures 208 is planar.

The optical devices 200A or 200B can undergo processing steps during and after fabrication. For example, when patterning the optical device layer 204 to form the optical devices 200A or 200B, the index-matched layer 108 and the substrate 100 can be damaged. The encapsulation layer 202 (shown in FIG. 2A) and the encapsulation material gradient 206 (shown in FIG. 2B) provide protection to the index-matched layer 108 and the substrate 100.

Figure 3:
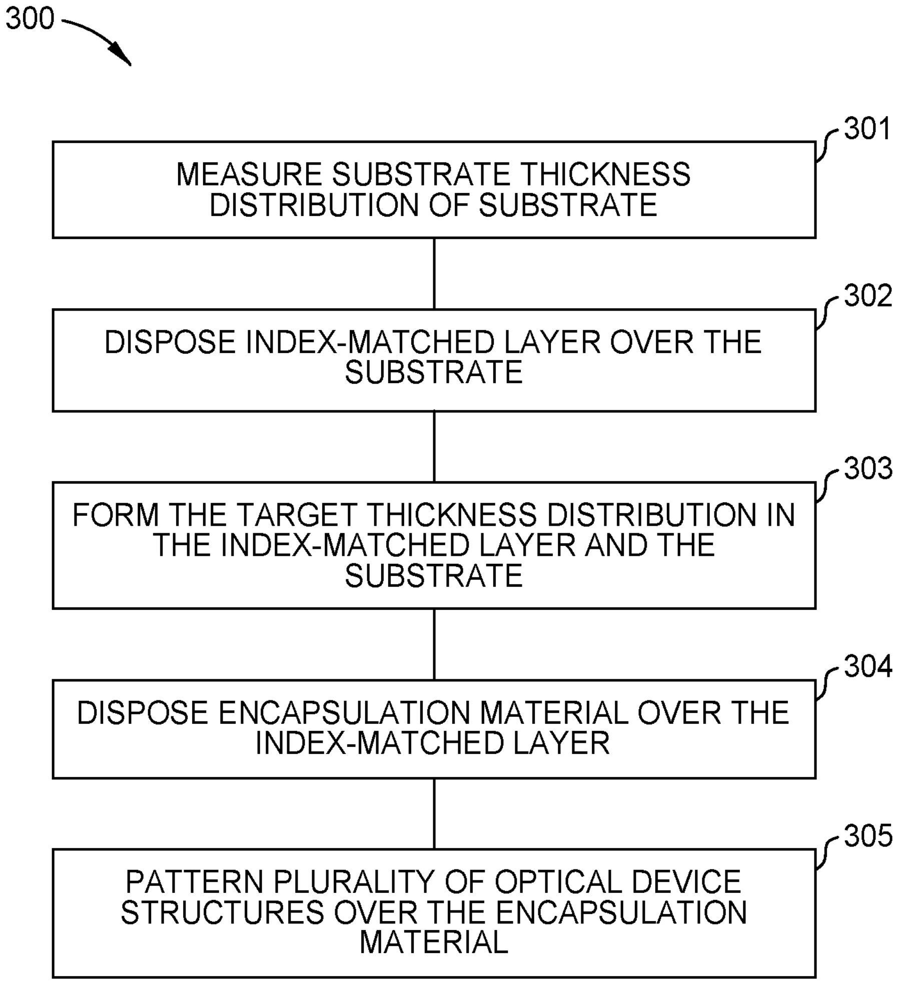
FIG. 3 is a flow diagram of a method for forming an optical device with a target thickness distribution as shown in FIGS. 4A-4E, according to embodiments.

FIG. 3 is a flow diagram of a method 300 for forming an optical device 200A or 200B with a target thickness distribution 116 as shown in FIGS. 4A-4E. The method 300 may be utilized to form the target thickness distribution 116 in eyepiece areas 101 and/or inactive areas 104 of a substrate 100 and an index-matched layer 108. FIGS. 4A-4E are schematic, cross-sectional views of an eyepiece area 101. Although FIGS. 4A-4E correspond to an eyepiece area 101, the FIGS. 4A-4E are not limited to the eyepiece areas 101 and may also correspond to an inactive area 104 where the target thickness distribution 116 is to be formed.

Figure 4A:
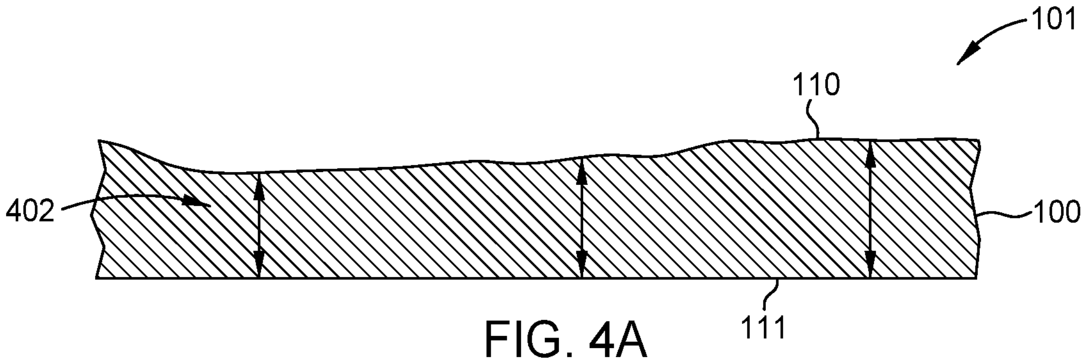
FIGS. 4A-4E are schematic, cross-sectional views of an eyepiece area, according to embodiments.

At operation 301, as shown in FIG. 4A, a substrate thickness distribution 402 of the substrate 100 is measured. The substrate thickness distribution 402 is defined by the distance between the bottom surface 111 and a top surface 110 of the substrate 100 across the eyepiece area 101. The substrate thickness distribution 402 is a measured thickness distribution of the substrate 100 prior to depositing the index-matched layer 108 to form a target thickness distribution 116.

Figure 4B:
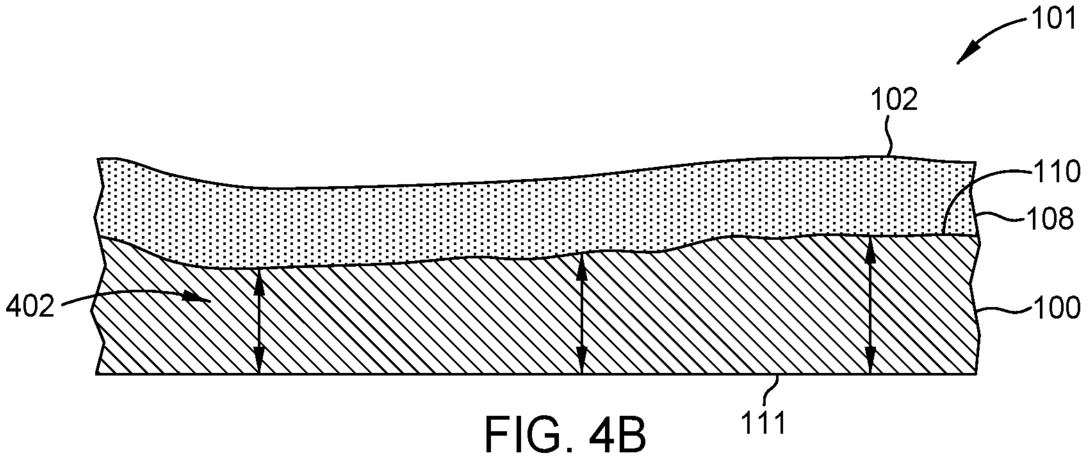

At operation 302, as shown in FIG. 4B, the index-matched layer 108 is disposed over the substrate 100. In one embodiment, the index-matched layer 108 may be disposed over the top surface 110 of the substrate 100 by a spin-on coating processes. In another embodiment, the index-matched layer 108 is disposed with an inkjet printing process. The index-matched layer 108 has a refractive index that matches or substantially matches the refractive index of the substrate 100.

Figure 4C:
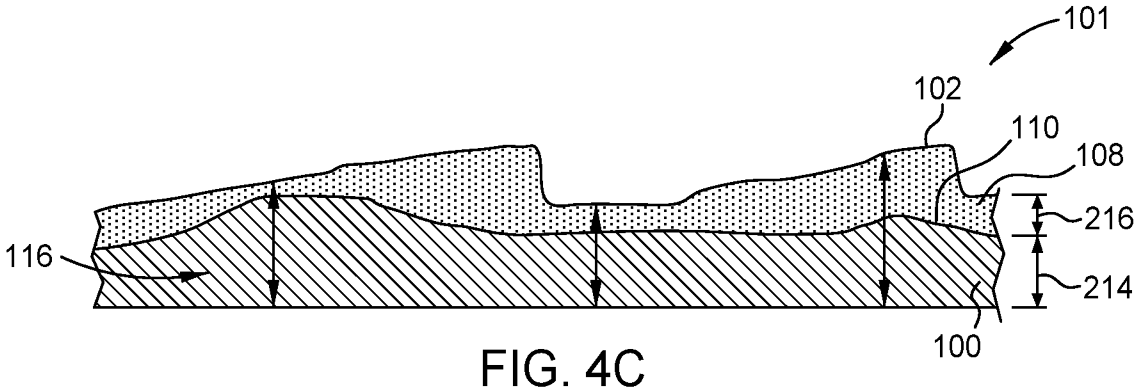

At operation 303, as shown in FIG. 4C, the target thickness distribution 116 is formed in the index-matched layer 108 and the substrate 100. The target thickness distribution 116 is formed by determining a thickness change needed to form the target thickness distribution 116 from the substrate thickness distribution 402.

In one embodiment, which can be combined with other embodiments described herein, the target thickness distribution 116 is formed with a lithography process. The lithography process is a gray-tone lithography process. The gray-tone lithography includes patterning a gray-tone resist (not shown) with a resist thickness distribution that corresponds to the target thickness distribution 116. The gray-tone resist is developed with a lithography process, such as photolithography and digital lithography. In another embodiment, which can be combined with other embodiments described herein, the target thickness distribution 116 is formed with an inkjet printing process. In embodiments where the inkjet printing process is utilized, the index-matched layer 108 is directly deposited onto the substrate 100 to have the target thickness distribution 116. Direct deposition of the appropriate amount of the index-matched layer 108 allows for the formation of the target thickness distribution 116.

By utilizing gray-tone lithography and inkjet printing processes to apply the index-matched layer 108, maskless application and patterning of the index-matched layer 108 to form the target thickness distribution 116 is possible. By forming the target thickness distribution 116 in each of the eyepiece areas 101, variation of substrate thickness is reduced. As such, improvement of optical device quality and fabrication time are obtained. For example, further control of the propagation of light through the optical devices is possible due to the consistency of the target thickness distribution 116 across the eyepiece areas 101.

Figure 4D:
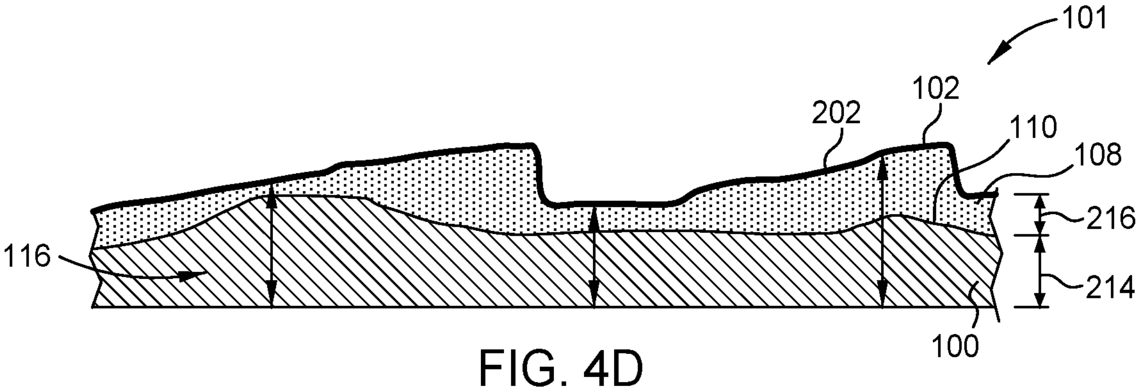
Figure 4E:
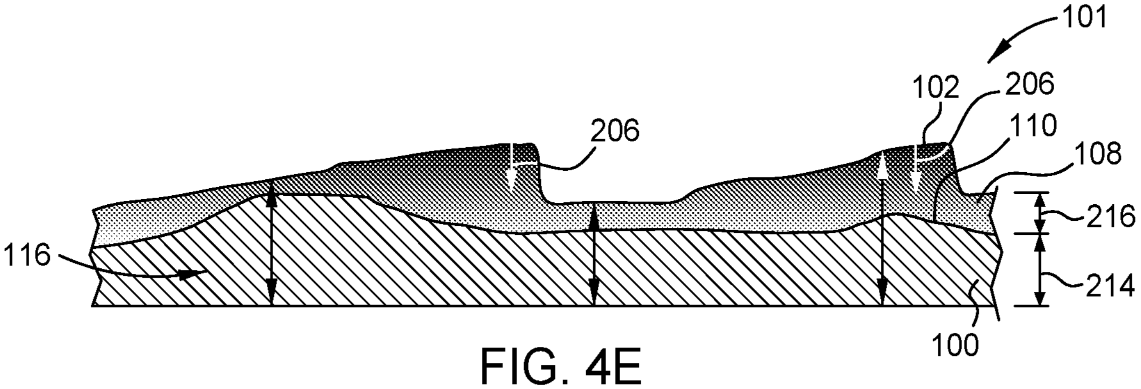

At operation 304, as shown in FIGS. 4D and 4E, an encapsulation material is disposed over the index-matched layer 108. The encapsulation material is disposed as one of an encapsulation layer 202 or an encapsulation material gradient 206. FIG. 4D shows the encapsulation layer 202. FIG. 4E shows the encapsulation material gradient 206. The encapsulation material protects the index-matched layer 108 and the substrate 100 from processing methods that can damage the index-matched layer 108 and the substrate 100 if exposed. For example, the processing methods include wet processing, high-temperature processing, vacuum processing, and/or plasma processing. The encapsulation layer 202 is disposed via a deposition process. For example, the deposition process includes PVD, CVD, ALD, spin-on coating, or inkjet. The encapsulation material gradient 206 is formed by infiltrating the encapsulation material directly into the index-matched layer 108 such that the encapsulation material is within the index-matched layer 108. The encapsulation material is infiltrated using an ALD process. The infiltration process provides for increased refractive index of the index-matched layer 108 and improved environmental resistance.

At operation 305, as shown in FIGS. 2A and 2D, a plurality of optical device structures 208 are patterned over the encapsulation material. The plurality of optical device structures 208 are patterned from an optical device layer. The plurality of optical device structures 208 are patterned via functional nanoimprint lithography, nanoimprint lithography and etching, or photolithography and etching. Additionally, during the patterning of the plurality of optical device structures 208 or during post-processing, wet processing, high-temperature processing, vacuum processing, and/or plasma processing can occur. The encapsulation material is operable to protect the index-matched layer 108 from the wet processing, high-temperature processing, vacuum processing, and/or plasma processing, which is harmful to the index-matched layer 108. For example, the refractive index of the index-matched layer 108 is maintained, which is critical to ensuring performance of the optical device.

In summation, embodiments described herein provide for the introduction of an encapsulation material into an optical device formed with a same thickness distribution at one or more eyepiece areas across a substrate. The target thickness distribution formed in at least each eyepiece area reduces variation of substrate thickness from substrate to substrate. As such, improvement of optical device quality and fabrication time are obtained. Forming the target thickness distribution in the substrate and the index-matched layer with maskless patterning such as gray-tone lithography and inkjet printing eliminates subsequent processing steps to achieve the target thickness distribution. As such, cost and fabrication complexity are reduced. The materials compatible with the gray-tone lithography and inkjet printing processes are sensitive to various wet processing, high-temperature processing, vacuum processing, and/or plasma processing. As such, providing encapsulation material between the optical device layer and the index-matched layer will protect the index-matched layer from damage and improve overall performance of the optical device.

While the foregoing is directed to embodiments of the present disclosure, other and further embodiments of the disclosure may be devised without departing from the basic scope thereof, and the scope thereof is determined by the claims that follow.

What is claimed is:

1. An optical device, comprising:

a substrate, the substrate having a substrate depth defined by a top surface of the substrate and a bottom surface of the substrate, wherein the substrate depth varies across the optical device;

an index-matched layer disposed over the substrate, the index-matched layer having a layer depth defined by an upper surface of the index-matched layer and a lower surface of the index-matched layer, wherein the layer depth varies across the optical device, and wherein the substrate has a first refractive index and the index-matched layer has a second refractive index, wherein the second refractive index is substantially equal to the first refractive index;

a plurality of optical device structures formed over the index-matched layer, wherein adjacent structure top surfaces of the plurality of optical device structures are planar; and an encapsulation material disposed between the plurality of optical device structures and the index-matched layer.

2. The optical device of claim 1, wherein the encapsulation material has an encapsulation refractive index, wherein the encapsulation material is substantially equal to the first refractive index and the second refractive index.

3. The optical device of claim 1, wherein the encapsulation material has an encapsulation refractive index, wherein the encapsulation material is substantially equal to a refractive index of the plurality of optical device structures.

4. The optical device of claim 1, wherein the encapsulation material is an encapsulation layer disposed between the plurality of optical device structures and the index-matched layer, the encapsulation layer conformal to the upper surface of the index-matched layer.

5. The optical device of claim 1, wherein the encapsulation material is a nitrogen containing material.

6. The optical device of claim 1, wherein the plurality of optical device structures are angled relative to the bottom surface of the substrate.

7. The optical device of claim 1, wherein a device height defined from the bottom surface to each of the structure top surfaces is constant.

8. The optical device of claim 1, wherein the index-matched layer is polymer material or a nanoparticle based material.

9. An optical device, comprising:

a substrate, the substrate having a substrate depth defined by a top surface of the substrate and a bottom surface of the substrate, wherein the substrate depth varies across the optical device;

an index-matched layer disposed over the substrate, the index-matched layer having a layer depth defined by an upper surface of the index-matched layer and a lower surface of the index-matched layer, wherein the layer depth varies across the optical device;

a plurality of optical device structures formed over the index-matched layer, wherein adjacent structure top surfaces of the plurality of optical device structures are planar; and an encapsulation material disposed between the plurality of optical device structures and the index-matched layer, wherein the encapsulation material is infiltrated into the index-matched layer to form an encapsulation material gradient, wherein a concentration of the encapsulation material decreases as a distance from an upper surface of the index-matched layer is increased.

10. An optical device, comprising:

a substrate, the substrate having a substrate depth defined by a top surface of the substrate and a bottom surface of the substrate, wherein the substrate depth varies across the optical device;

an index-matched layer disposed over the substrate, the index-matched layer having a layer depth defined by an upper surface of the index-matched layer and a lower surface of the index-matched layer, wherein the layer depth varies across the optical device;

a plurality of optical device structures formed over the index-matched layer, wherein adjacent structure top surfaces of the plurality of optical device structures are planar; and an encapsulation material disposed between the plurality of optical device structures and the index-matched layer, wherein the encapsulation material is infiltrated into the index-matched layer to form an encapsulation material gradient, wherein a concentration of the encapsulation material in the encapsulation material gradient is higher where the index-matched layer is furthest from the bottom surface of the substrate.

11. A method of forming an optical device, comprising:

disposing an index-matched layer over a substrate, the substrate having a substrate depth defined by a top surface of the substrate and a bottom surface of the substrate, wherein the substrate depth varies across the optical device such that a lower surface of the index-matched layer varies according to the substrate depth, wherein the substrate has a first refractive index and the index-matched layer has a second refractive index, wherein the second refractive index is substantially equal to the first refractive index;

patterning the index-matched layer, wherein the index-matched layer and the substrate define a target thickness distribution that varies across the substrate;

disposing an encapsulation layer over an upper surface of the index-matched layer;

disposing an optical device film over the encapsulation layer; and patterning a plurality of optical device structures in the optical device film, wherein adjacent structure top surfaces of the plurality of optical device structures are planar, wherein a device height defined from the bottom surface to each of the structure top surfaces is constant.

12. The method of forming an optical device of claim 11, wherein the patterning the index-matched layer is via a gray-tone lithography process, wherein the gray-tone lithography process includes patterning a gray-tone resist with a resist thickness distribution that corresponds to the target thickness distribution.

13. The method of forming an optical device of claim 11, wherein the patterning the index-matched layer includes an inkjet printing process, wherein the index-matched layer is disposed via the inkjet printing process to have the target thickness distribution.

14. The method of forming an optical device of claim 11, wherein the patterning the plurality of optical device structures includes a nanoimprint lithography process.

15. A method of forming an optical device, comprising:

disposing an index-matched layer over a substrate, the substrate having a substrate depth defined by a top surface of the substrate and a bottom surface of the substrate, wherein the substrate depth varies across the optical device such that a lower surface of the index-matched layer varies according to the substrate depth;

patterning the index-matched layer, wherein the index-matched layer and the substrate define a target thickness distribution that varies across the substrate;

disposing an encapsulation material into the index-matched layer to form an encapsulation material gradient, wherein a concentration of the encapsulation material decreases as a distance from an upper surface of the index-matched layer is increased;

disposing an optical device film over the encapsulation material; and patterning a plurality of optical device structures in the optical device film, wherein adjacent structure top surfaces of the plurality of optical device structures are planar, wherein a device height defined from the bottom surface to each of the structure top surfaces is constant.

16. The method of forming an optical device of claim 15, wherein the patterning the index-matched layer is via a gray-tone lithography process, wherein the gray-tone lithography process includes patterning a gray-tone resist with a resist thickness distribution that corresponds to the target thickness distribution.

17. The method of forming an optical device of claim 15, wherein the patterning the index-matched layer includes an inkjet printing process, wherein the index-matched layer is disposed via the inkjet printing process to have the target thickness distribution.

18. The method of forming an optical device of claim 15, wherein the patterning the plurality of optical device structures includes a nanoimprint lithography process.

19. The method of forming an optical device of claim 15, wherein the disposing the encapsulation material includes an atomic layer deposition (ALD) process.

* * * * *